(12) United States Patent
Haselhoff et al.

(10) Patent No.: US 6,215,305 B1
(45) Date of Patent: Apr. 10, 2001

(54) METHOD AND DEVICE FOR IMAGING AN OBJECT BY MEANS OF MAGNETIC RESONANCE

(75) Inventors: Eltjo H. Haselhoff; Jan F. L. De Becker, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/291,557

(22) Filed: Apr. 14, 1999

(30) Foreign Application Priority Data

Apr. 17, 1998 (EP) ................................................ 98201264

(51) Int. Cl.$^7$ ............................................................ G01V 3/00
(52) U.S. Cl. ............................. 324/309; 324/307; 324/300
(58) Field of Search ................................... 324/309, 300, 324/307

(56) References Cited

U.S. PATENT DOCUMENTS

| | | | |
|---|---|---|---|
| 4,674,046 | * 6/1987 | Ozeki et al. | 364/414 |
| 5,323,111 | 6/1994 | Suzuki | 324/309 |
| 5,512,827 | 4/1996 | Hardy et al. | 324/309 |
| 5,514,962 | 5/1996 | Cline et al. | 324/309 |

* cited by examiner

Primary Examiner—Christine Oda
Assistant Examiner—Brij B. Shrivastav
(74) Attorney, Agent, or Firm—John F. Vodopia

(57) ABSTRACT

A method for magnetic resonance imaging of a part of a human body arranged in a steady magnetic field. The part of the body to be imaged may contain, for example a coronary artery in the vicinity of the heart. Other feasible parts are, for example joints or the cruciate ligaments. To this end, two MR images are made of the coronary artery extending between the first imaging plane and the second imaging plane of the first and the second MR image, respectively, a first cross-section of the coronary artery being reproduced in the first MR image whereas a second cross-section of the coronary artery is reproduced in the second MR image. Subsequently, a third imaging plane for a third MR image is determined by an operator who determines two points by indicating, in the first and the second image, points of intersection of the first and the second cross-section of the coronary artery in the first and the second imaging plane. The parameters for forming a third MR image of the third imaging plane are subsequently calculated on the basis of these points of intersection and a third point that can be chosen at liberty. The third MR image then largely reproduces the coronary artery, except when the coronary artery is strongly curved.

8 Claims, 2 Drawing Sheets

METHOD AND DEVICE FOR IMAGING AN OBJECT BY MEANS OF MAGNETIC RESONANCE

BACKGROUND OF THE INVENTION

1. Field of the Invention

The invention relates to a magnetic resonance (MR) method for imaging a part of a human or animal body which is arranged in a steady magnetic field, which method includes the following steps:

image of the second imaging plane of the part, a first cross-section of said part being reproduced in the first MR image whereas a second cross-section of said part is reproduced in the second MR image, forming a third MR image of the third imaging plane from information of the first and second MR images. 2. Description of Related Art The invention also relates to an MR device for carrying out such a method.

An imaging plane is to be understood to mean herein a slice of the body which is visualized by means of an MR image.

A method of this kind is known from U.S. Pat. No. 5,514,962. The known method is used to form MR images for a functional analysis of a part of the body, for example a heart of the human or animal body. In order, it is used to form perfusion MR images of the heart or MR images of the coronary artery system around the heart. In such cases it is important to image an as large as possible part of a coronary artery. Because measurement of MR signals often utilizes a technique which requires a patient to hold his or her breath during a measurement, it is important that an appropriate orientation of the third imaging plane is found as quickly as possible in order to reduce discomfort to the patient.

To this end, according to the known method imaging information is measured and a three-dimensional model of the part of the body is displayed on a monitor by means of a workstation. In order to determine the third imaging plane of the third image, reproducing most of the part, an auxiliary plane is subsequently displayed on the monitor. Subsequently, the operator shifts the auxiliary plane, by way of translation and rotation of the auxiliary plane, in such a manner that the auxiliary plane displayed on the monitor intersects the three-dimensional model for a largest part. The co-ordinates of the auxiliary plane thus found subsequently determine the co-ordinates of the third imaging plane. During a next step MR signals are measured for the reconstruction of the third MR image of the third imaging plane of the part. It is a drawback of the known method that a large amount of time is required in order to determine a three-dimensional model of adequate resolution. Examples of parts of the body having a small cross-section are, for example parts of the coronary artery which have a cross-section of approximately 1 mm.

SUMMARY OF THE INVENTION

It is an object of the invention to reduce the amount of time required to display the third imaging plane of an as large as possible part of the body which extends between the first and the second imaging plane. To achieve this, the method according to the invention is characterized in that the determination of a third imaging plane involves the determination of two points of the third imaging plane by a first point of the first cross-section of the part in the first MR image and a second point of the second cross-section of the part in the second MR image. The invention is based on the recognition of the fact that the determination of two points of the third imaging plane being the first point of the first cross-section of the part with the first imaging plane and the second point of the second cross-section of the part of the second imaging plane, respectively, and a third point to be selected defines the third imaging plane in such a manner that the part is most largely imaged. An operator can simply indicate said first and second points in the first cross-section of the part in the first MR image and the second cross-section of the part in the second MR image. The co-ordinates of the first, the second and the third point are subsequently converted into adjusting parameters for an MR imaging pulse sequence for the measurement of MR signals for the reconstruction of the third MR image of the third imaging plane.

A special version of the method according to the invention is characterized in that the first and the second imaging plane are chosen so as to extend in parallel.

A further version of the method according to the invention is characterized in that it also includes steps for forming a fourth MR image of the fourth imaging plane of the part of the body, thus imaging a fourth cross-section of the part in which a third point of the third imaging plane is furthermore determined by a point of the fourth cross-section of the part in the fourth MR image. The third imaging plane is thus completely defined, so that the chances of the third imaging plane containing a complete cross-section of the part are enhanced. The third imaging plane thus defined then contains parts of the coronary artery of said three imaging planes and, unless the coronary artery is strongly curved, also the parts between said parts.

A further version of the method according to the invention is characterized in that an MR image is formed of a corrected imaging plane whose co-ordinates are determined by a translation in a direction of the third imaging plane or by a rotation about an axis of the third imaging plane.

An MR device for magnetic resonance imaging of a part of a human or animal body to be arranged in the device, which MR device also includes:

means for sustaining the steady magnetic field, means for generating RF pulses, means for generating gradients in the steady magnetic field, a control unit for generating control signals for the means for generating RF pulses and the means for generating the gradients, means for measuring MR signals, means for reconstructing a first MR image and a second MR image from the measured MR signals from a first imaging plane and a second imaging plane, respectively, of a part of the body to be arranged in the MR device, a first cross-section of said part being reproduced in the first MR image whereas a second cross-section is reproduced in the second MR image, means for determining a third imaging plane of a third cross-section of the first part, and means for reconstructing a third MR image of the third imaging plane, characterized in that the means for determining a third imaging plane are arranged in such a manner that two points of the third imaging plane are determined by a first point of the first cross-section of the part in the first MR image and a second point of the second cross-section of the part in the second MR image.

BRIEF DESCRIPTION OF THE DRAWINGS

The above and other, more detailed aspects of the invention will be described in detail hereinafter, by way of example, with reference to the drawing.

Therein.

DETAILED DESCRIPTION OF THE PREFERRED EMBODIMENT

Figure 1:
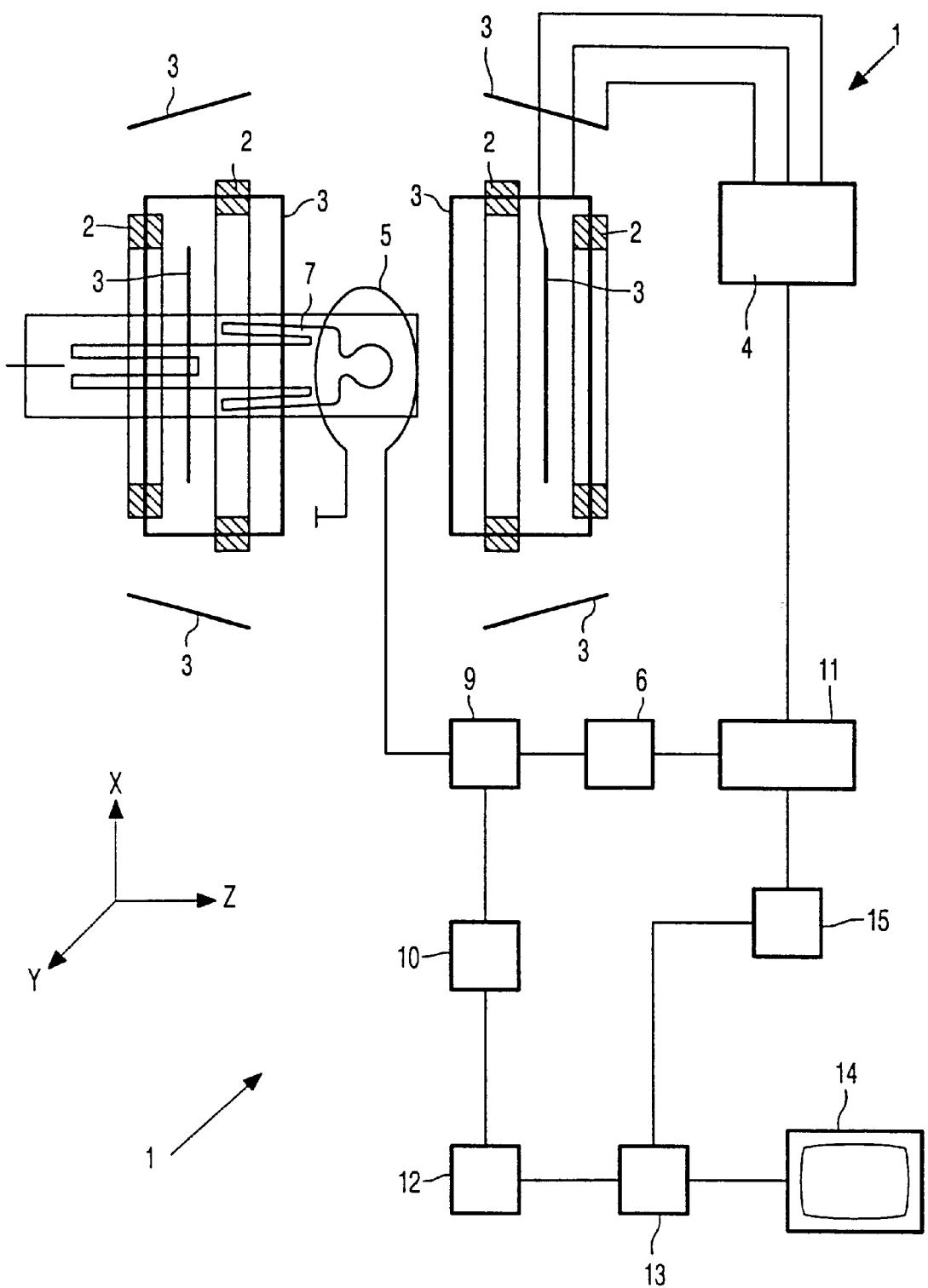
FIG. 1 shows a magnetic resonance imaging device.

FIG. 1 shows a magnetic resonance imaging device which includes a first magnet system 2 for generating a steady magnetic field and also various gradient coils 3 for generating additional magnetic fields which are superposed on the steady magnetic field and cause a gradient in the steady magnetic field in three respective orthogonal directions of a co-ordinate system X, Y, Z. Generally speaking, a gradient in the first direction is referred to as a read-out gradient, a gradient in the second direction as a phase encoding gradient and a gradient in the third direction as a selection gradient. The Z direction of the co-ordinate system shown corresponds by convention to the direction of the steady magnetic field in the magnet system 2. The measuring co-ordinate system x, y, z to be used can be chosen independently of the X, Y, Z co-ordinate system shown in FIG. 1. The gradient coils 3 are fed by the power supply unit 4. The MR device also includes an RF coil 5. The RF coil 5 serves to generate RF magnetic fields and is connected to an RF transmitter and modulator 6. A receiving coil is used to receive the magnetic resonance signal generated by the RF field in the object 7, or a part of the object, for example a human or animal body to be examined in vivo. This coil may be the same coil as the RF transmitter coil 5. The magnet system 2 encloses an examination space which is large enough to accommodate a part of the body 7 to be examined. The RF transmitter coil 5 is arranged on or around a part of the body 7 within the examination zone. The RF transmitter coil 5 is connected, via a transmission/reception circuit 9, to a signal amplifier and demodulation unit 10. The control unit 11 controls the RF transmitter and modulator 6 and the power supply 4 so as to generate special MR imaging pulse sequences which include RF pulses and gradients. The phase and amplitude derived from the demodulation unit 10 are applied to a processing unit 12. The processing unit 12 processes the signal values presented, for example using a two-dimensional Fourier transformation, so as to form an MR image. An image processing unit 13 visualizes the MR image via a monitor 14. The MR device also includes an input device 15 which is coupled to the image processing unit 13 so as to visualize a pointer indication on the monitor 14. The input device is also connected to the control device 11 in order to conduct a change of adjusting parameters to the control device 11.

The invention will be described in detail hereinafter, by way of example, on the basis of a method which utilizes an MR imaging pulse sequence in the form of a known echo planar imaging (EPI) imaging pulse sequence for the formation of MR images. An EPI imaging pulse sequence is known from the book "Magnetic Resonance Imaging", written by M. T. Vlaardingerbroek, Springerverlag, 1996. Using such EPI imaging pulse sequences, MR signals are measured and on the measured MR signals, for example a two-dimensional Fourier transformation is performed so as to reconstruct an MR image of a part of the body, for example an imaging plane which contains a part of a heart. Besides said EPI imaging pulse sequences, however, other known MR imaging pulse sequences can also be used, for example a spin echo (SE) imaging pulse sequence, a rapid acquisition and relaxation enhancement (RARE) imaging pulse sequence and a gradient and spin echo (GRASE) imaging pulse sequence. These imaging pulse sequences are also known from the cited "Magnetic resonance imaging" by M. T. Vlaardingerbroek, Springerverlag, 1996.

Figure 2:
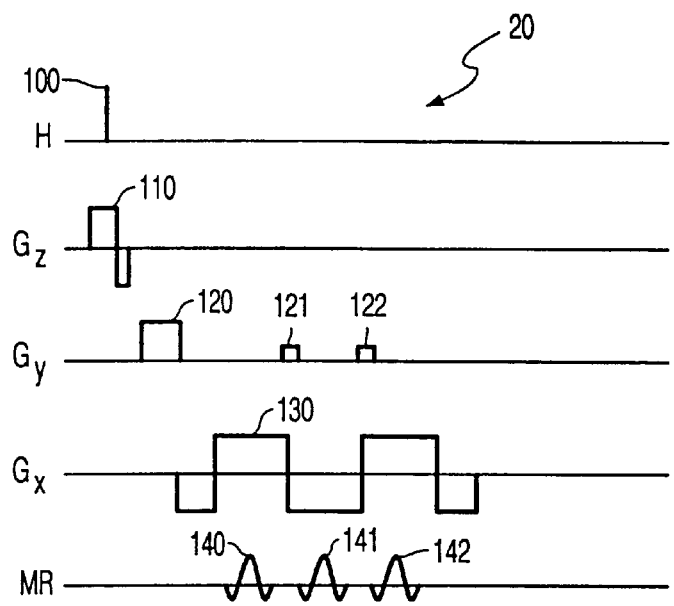
FIG. 2 shows an EPI pulse sequence.

FIG. 2 shows an EPI imaging pulse sequence 20 which includes an excitation RF pulse and gradients. The EPI imaging pulse sequence commences by application of an excitation RF pulse 100, having a flip angle, and a selection gradient 110 for exciting spins within a measuring zone, for example an imaging plane in the x, y plane through the body 7. The flip angle amounts to, for example 90°. The selection gradient is oriented in the z direction. After slice selection, an initial phase encoding gradient 120 and a read-out gradient 130 are applied. Further phase encoding gradients 121, 122, referred to as blips, are applied after the second and further zero-crossings of the read-out gradients, so that MR signals 140, 141, 142 can be measured whose sampling instants are situated on lines which are uniformly distributed in the k space. The EPI imaging pulse sequence 20 is repeated for different values of the initial phase encoding gradients 120 in order to measure a complete set of MR signals which are associated with, for example 128 or 256 lines in the k space. In the context of the present patent application a k space is to be understood to mean a spatial frequency domain in which a trajectory is followed during the measurement of the MR signals by application of gradients to the steady magnetic field. The trajectory in the k space is determined by the time integral of the gradients applied during the interval between the excitation of the spins and the instant in time at which the MR signal is measured. The measured values of the MR signals corresponding to the most important part of the trajectory or trajectories produce the inverse Fourier transformed values of an image of the imaging plane.

In order to determine an MR image of a relevant part of an arbitrarily oriented part of the body, for example a part of the coronary artery of the heart, in conformity with a first version of the method of the invention a first MR image of a first imaging plane of a first part of the coronary artery and a second MR image of a second imaging plane of a second part of the coronary artery are formed during a first step, the first and the second imaging plane preferably being chosen so that they are oriented in parallel and substantially perpendicularly to a longitudinal axis, for example the head-feet axis of the body in the heart, the position of the heart relative to the head-feet axis being estimated in a customary manner by an expert. Furthermore, the part of the coronary artery extends between the first imaging plane and the second imaging plane.

Figure 3:
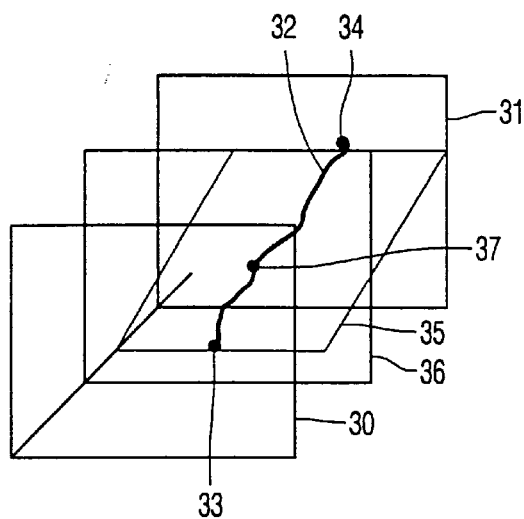
FIG. 3 shows a first, a second and a third imaging plane.

FIG. 3 shows the first imaging plane 30 and the second imaging plane 31. Subsequently, the first MR image and the second MR image are displayed on a monitor 14. In order to determine the co-ordinates of a first point of a third imaging plane of a third MR image, reproducing the relevant part of the coronary artery, an operator indicates a point of the first cross-section 33 of the first part of the coronary artery 32 by means of a pointer indication on the monitor 14, to be controlled by means of the input device 15, and instructs the input device 15 to determine the co-ordinates of the first point from the position of the pointer indication in a manner which is known to those skilled in the art. An input device 15 of this kind includes, for example a computer mouse or track ball and associated buttons. Analogously, a second point of the third imaging plane is determined by indicating a point of a second cross-section 34 of the second part of the coronary artery in the second MR image. The co-ordinates of the third imaging plane 35 of a third cross-section of the coronary artery 32 with the third imaging plane are subsequently determined by the input device 15 on the basis of the first and the second point determined and a third point which can be selected at liberty. The third point is preferably determined on the basis of a fourth MR image. To this end, the method includes a step for forming the fourth MR image of a fourth imaging plane 36 which is preferably selected so as to extend parallel to the first and the second imaging plane 30, 31, a fourth cross-section 37 of a third part of the coronary artery 32 with the fourth imaging plane thus being imaged. Via the indication on the monitor 14 and the input device 15, the operator subsequently determines the third point 37 of the third imaging plane 36 from the fourth cross-section of the third part of the coronary artery 32 and the fourth imaging plane 36. On the basis of the indicated points, the input device 15 subsequently determines the adjusting parameters for the third imaging plane 35 and applies these parameters to the control unit 11 of the MR device so that an MR imaging pulse sequence can be generated for the measurement of MR signals wherefrom the third MR image of the third imaging plane 35 is reconstructed. A suitable MR imaging pulse sequence is, for example the EPI imaging pulse sequence mentioned in the description of FIG. 2. The third MR image thus formed then contains said three points 33, 34, 37 of the coronary artery 32 and, unless the coronary artery is strongly curved, also the points between said three points 33, 34, 37.

On the basis of the third MR image of the third imaging plane 35, the orientation of the third imaging plane 35 can be further enhanced, the relevant part of the coronary artery 32 which is imaged in a next MR image can then be enlarged. This correction of the orientation of the third imaging plane 35 will be described with reference to FIG. 4.

Figure 4:
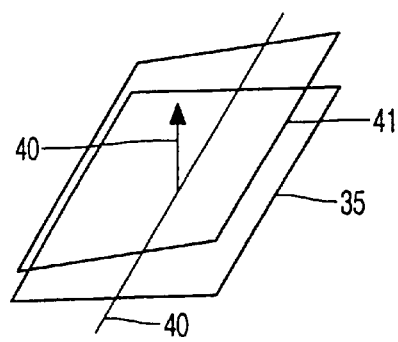
FIG. 4 shows a corrected imaging plane.

FIG. 4 shows the third imaging plane 35. The co-ordinates of the corrected imaging plane 41 are determined, for example by a translation in a direction of a first axis 40, substantially perpendicular to the third imaging plane 35, or a rotation about a second axis 40° of the third imaging plane 35, the operator entering a desired translation or rotation by means of the input device 15 which applies the newly calculated adjusting parameters of the EPI imaging pulse sequence to the control unit 11 in order to measure MR signals from the corrected imaging plane 41. The processing unit subsequently reconstructs a corrected MR image of the corrected imaging plane 41 from the MR signals measured. The described method can also be used for determining an image of other parts of the body, for example the part of a joint of a human or animal body.

All references cited herein are incorporated herein by reference in their entirety and for all purposes to the same extent as if each individual publication or patent or patent application was specifically and individually indicated to be incorporated by reference in its entirety for all purposes.

What is claimed is:

1. A magnetic resonance (MR) method for imaging a part of a human or animal body which is arranged in a steady magnetic field comprising:

forming a first MR image of a first imaging plane of the part and a second MR image of a second imaging plane of the part, a first cross-section of said part being reproduced in the first MR image and a second cross-section of said part being reproduced in the second MR image, determining a third imaging plane of a third cross-section of the part and forming a third MR image of the third imaging plane from information from the first and second MR images, wherein the third imaging plane comprises a first point and a second point, and wherein determining the third imaging plane involves determining the first point in the first cross-section of the part in the first MR image and determining the second point in the second cross-section of the part in the second MR image.

2. A method as claimed in claim 1 wherein the first and the second plane are chosen to extend in parallel.

3. A method as claimed in claim 1 further comprising a step of forming a fourth MR image of a fourth imaging plane, a fourth cross-section of the part being reproduced in the fourth MR image, and wherein the third imaging place comprises a third point, and wherein the step of determining the third imaging plane further comprises determining the third point in the fourth cross-section of the part in the fourth MR image.

4. A method as claimed in claim 3 wherein the fourth imaging plane is chosen to extend parallel to the second imaging plane.

5. A method as claimed in claim 1 further comprising forming an MR image of a corrected imaging plane whose co-ordinates are determined by a translation in a direction of the third imaging plane or by a rotation about an axis of the third imaging plane.

6. The method of claim 1 further comprising forming an MR image of a corrected imaging plane whose co-ordinates are determined by a translation in a direction of the third imaging plane or by a rotation about an axis of the third imaging plane.

7. A device for magnetic resonance (MR) imaging of a part of a human or animal body which is arranged in the device comprising:

means for generating a steady magnetic field, means for generating RF pulses, means for generating gradients in the steady magnetic field, a control unit for generating control signals for the means for generating RF pulses and the means for generating the gradients, means for measuring MR signals, means for reconstructing a first MR image and a second MR image from measured MR signals from a first imaging plane and a second imaging plane, respectively, of the part of the body, a first cross-section of said part being reproduced in the first MR image and a second cross-section of said part being reproduced in the second MR image, means for determining a third imaging plane of a third cross-section of the part from information from the first and second MR images, wherein the third imaging plane comprises a first point and a second point, and means for reconstructing a third MR image of the third imaging plane, wherein the means for determining the third imaging plane determine the first point in the first cross-section of the part in the first MR image and determine the second point in the second cross-section of the part in the second MR image.

8. An MR device as claimed in claim 7 further comprising input means for entering the first and the second points present in the first and second MR images, respectively.

* * * * *